United States Patent
Chou et al.

(10) Patent No.: US 9,771,256 B2
(45) Date of Patent: Sep. 26, 2017

(54) MICRO ELECTRO MECHANICAL SYSTEM (MEMS) DEVICE HAVING VIA EXTENDING THROUGH PLUG

(71) Applicant: TAIWAN SEMICONDUCTOR MANUFACTURING COMPANY LIMITED, Hsin-Chu (TW)

(72) Inventors: Chung-Yen Chou, Hsinchu (TW); Lee-Chuan Tseng, New Taipei (TW); Chia-Shiung Tsai, Hsin-Chu (TW); Ru-Liang Lee, Hsinchu (TW)

(73) Assignee: Taiwan Semiconductor Manufacturing Company Limited (TW)

( * ) Notice: Subject to any disclaimer, the term of this patent is extended or adjusted under 35 U.S.C. 154(b) by 16 days.

(21) Appl. No.: 14/318,667

(22) Filed: Jun. 29, 2014

(65) Prior Publication Data
US 2015/0375992 A1 Dec. 31, 2015

(51) Int. Cl.
| | |
|---|---|
| H01L 21/8242 | (2006.01) |
| H01L 23/48 | (2006.01) |
| H01L 21/3065 | (2006.01) |
| H01L 29/06 | (2006.01) |
| H01L 21/311 | (2006.01) |
| H01L 29/84 | (2006.01) |
| B81C 1/00 | (2006.01) |

(52) U.S. Cl.
CPC .. *B81C 1/00238* (2013.01); *B81C 2203/0792* (2013.01)

(58) Field of Classification Search
CPC .............. B81B 7/0006; B81C 1/00095; B81C 1/00238; B81C 2203/0792
USPC .................................................... 257/410–420
See application file for complete search history.

(56) References Cited

U.S. PATENT DOCUMENTS

| | | | | |
|---|---|---|---|---|
| 5,792,692 A * | 8/1998 | Li | ...................... | H01L 21/31116 257/E21.016 |
| 6,156,608 A * | 12/2000 | Chen | ...................... | H01L 28/91 257/E21.019 |
| 6,218,241 B1 * | 4/2001 | Chuang | ............. | H01L 27/10873 257/E21.649 |
| 8,237,228 B2 * | 8/2012 | Or-Bach | ............... | G03F 9/7076 257/369 |
| 8,872,287 B2 * | 10/2014 | Lan | ...................... | B81C 1/00246 257/415 |
| 2008/0284041 A1 * | 11/2008 | Jang | .................. | H01L 21/76898 257/774 |
| 2009/0114912 A1 * | 5/2009 | Large | ...................... | H01L 22/22 257/48 |

(Continued)

*Primary Examiner* — Marcos D Pizarro
*Assistant Examiner* — Nelson Garces
(74) *Attorney, Agent, or Firm* — Cooper Legal Group, LLC

(57) ABSTRACT

A semiconductor arrangement and methods of formation are provided. The semiconductor arrangement includes a micro-electro mechanical system (MEMS). A via opening is formed through a substrate, first dielectric layer and a first plug of the MEMS. The first plug comprises a first material, where the first material has an etch selectivity different than an etch selectivity of the first dielectric layer. The different etch selectivity of first plug allows the via opening to be formed relatively quickly and with a relatively high aspect ratio and desired a profile, as compared to forming the via opening without using the first plug.

20 Claims, 9 Drawing Sheets

(56) References Cited

U.S. PATENT DOCUMENTS

2013/0056858 A1* 3/2013 Ding .................. B81C 1/00246
257/622
2014/0319693 A1* 10/2014 Lin .................... B81C 1/00246
257/774

* cited by examiner

MICRO ELECTRO MECHANICAL SYSTEM (MEMS) DEVICE HAVING VIA EXTENDING THROUGH PLUG

BACKGROUND

Some semiconductor arrangements comprise one or more micro-electro-mechanical system (MEMS) devices. A MEMS device, such as a pressure sensor, generally performs at least one function, such as sensing, processing or actuating functions on the semiconductor arrangement.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
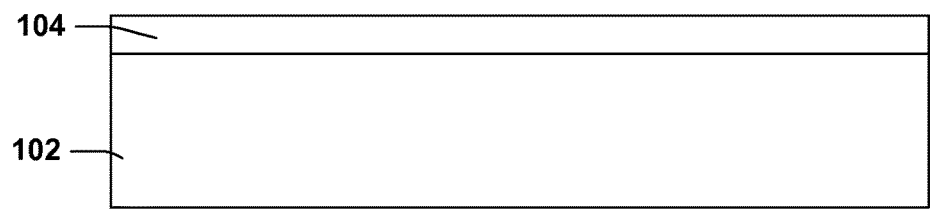
FIG. 1 is an illustration of a semiconductor arrangement at a stage of fabrication, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor arrangement and resulting structures formed thereby are provided herein.

According to some embodiments, a semiconductor arrangement comprises a micro electro mechanical system (MEMS) comprising a first composite. In some embodiments, the first composite comprises a first substrate over a first dielectric layer. In some embodiments, the first dielectric layer is over and in contact with a second dielectric layer of a second composite. In some embodiments, the second composite comprises the second dielectric layer and a second substrate, where the second dielectric layer is over the second substrate. In some embodiments, a via passes through the first substrate, the first dielectric layer and the second dielectric layer. In some embodiments, the via has sidewalls in contact with at least one of a first plug portion or a second plug portion. In some embodiments, at least one of the first plug portion or the second plug portion is in the first dielectric layer. In some embodiments, the via is connected to a first metal layer in the second dielectric layer. In some embodiments, the first metal layer comprises at least one of a portion of a complementary metal oxide semiconductor (CMOS) transistor, or a connection to a CMOS transistor.

According to some embodiments, the semiconductor arrangement is formed by forming the first composite. In some embodiments, forming the first composite comprises forming a first plug in the first dielectric layer. In some embodiments, the first plug is formed in contact with the first substrate. In some embodiments, the first plug is in a first dielectric layer portion. In some embodiments, the first plug is disposed along a first plug axis. In some embodiments, the first plug axis is disposed vertically through a central portion of the first plug. In some embodiments, a second dielectric layer portion is formed over the first plug and the first dielectric layer portion. In some embodiments, the first dielectric layer portion and the second dielectric layer portion comprise the first dielectric layer.

According to some embodiments, the first composite is inverted and placed over the second composite, such that the first dielectric layer is between the first substrate and the second dielectric layer of the second composite. In some embodiments, the first composite is placed such that the first plug axis intersects the first metal layer. In some embodiments, a via opening is formed such that the via opening is disposed along the first plug axis. In some embodiments, the via opening is formed through the first substrate, the first plug, and the second dielectric layer, such that the via opening exposes at least some of the first metal layer. In some embodiments, the via is formed in the via opening. In some embodiments, the via opening is formed by etching. In some embodiments, the first plug comprises a first material, where the first material has an etch selectivity different than an etch selectivity of the first dielectric layer. In some embodiments, the first dielectric layer comprises an oxide. In some embodiments, etching at least one of the first dielectric layer or the second dielectric layer absent the first plug has a low etching rate. In some embodiments, the first plug improves a profile of the via opening as compared to a via opening that is not formed through a first plug.

Figure 2:
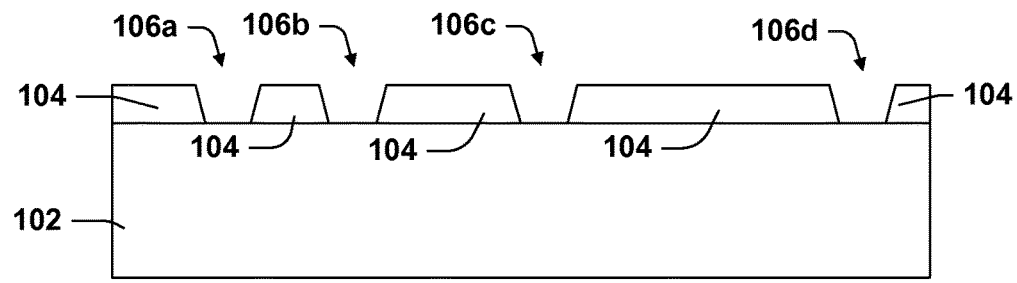
FIG. 2 is an illustration of a semiconductor arrangement at a stage of fabrication, in accordance with some embodiments.

FIGS. 1-14 are cross-sectional views of a semiconductor arrangement 100, according to some embodiments, at various stages of fabrication. Turning to FIG. 1, a first dielectric layer portion 104 is formed over a first substrate 102, according to some embodiments. In some embodiments, the first substrate 102 includes at least one of an epitaxial layer, a silicon-on-insulator (SOI) structure, a wafer, or a die formed from a wafer. In some embodiments, the first substrate 102 comprises at least one of silicon, carbon, etc. In some embodiments, the first dielectric layer portion 104 is formed by at least one of growth or deposition. In some embodiments, the first dielectric layer portion 104 is formed by at least one of physical vapor deposition (PVD), chemical vapor deposition (CVD), or atomic layer deposition (ALD). In some embodiments, the first dielectric layer portion 104 comprises an oxide, a nitride, etc. In some embodiments, the first substrate 102 has a thickness of between about 20 μm to about 50 μm Turning to FIG. 2, a first portion opening 106a, a first plug opening 106b, a second portion opening 106c, or a third portion opening 106d is formed in the first dielectric layer portion 104, according to some embodiments. In some embodiments, at least one of the first portion opening 106a, the first plug opening 106b, the second portion opening 106c, or the third portion opening 106d is formed by etching, such as an anisotropic etch. In some embodiments, at least one of the first portion opening 106a, the first plug opening 106b, the second portion opening 106c, or the third portion opening 106d has a top width greater than a bottom width. In some embodiments, at least one of the first portion opening 106a, the first plug opening 106b, the second portion opening 106c, or the third portion opening 106d exposes at least some of the first substrate 102.

Figure 3:
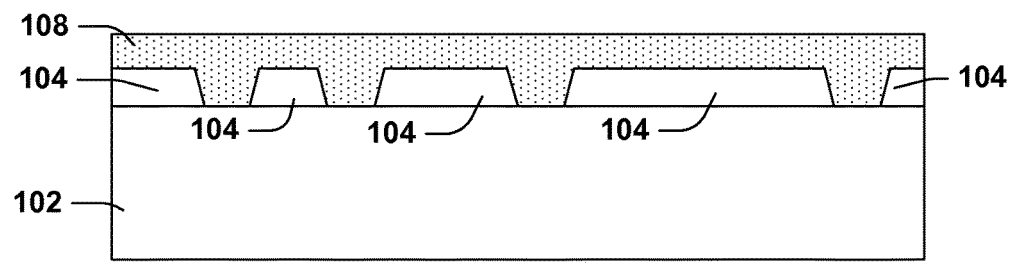
FIG. 3 is an illustration of a semiconductor arrangement at a stage of fabrication, in accordance with some embodiments.

Turning to FIG. 3, a first material 108 is formed over at least one of the first portion opening 106a, the first plug opening 106b, the second portion opening 106c, the third portion opening 106d, or the first dielectric layer portion 104, according to some embodiments. In some embodiments, the first material 108 is formed by at least one of growth or deposition. In some embodiments, the first material 108 is formed by at least one of PVD, CVD, or ALD. In some embodiments, the first material 108 has an etch selectivity different than an etch selectivity of the first dielectric layer portion 104. In some embodiments, the first material 108 comprises polysilicon.

Figure 4:
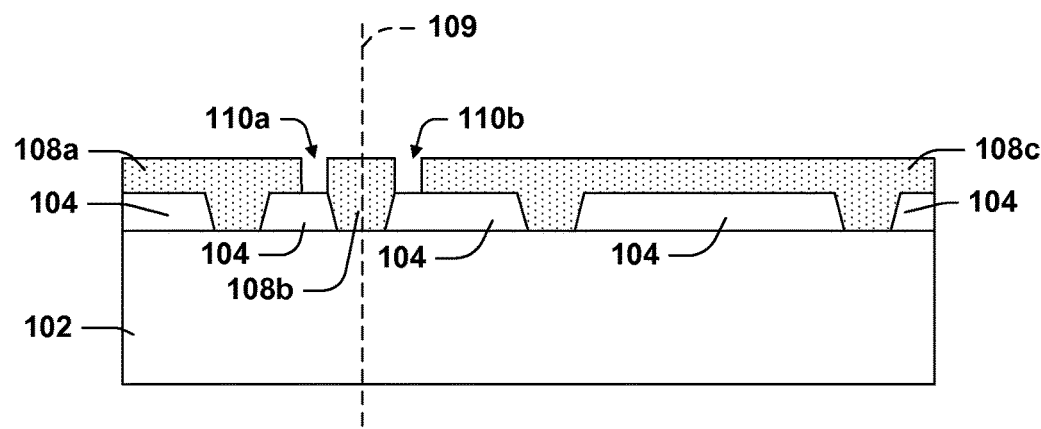
FIG. 4 is an illustration of a semiconductor arrangement at a stage of fabrication, in accordance with some embodiments.

Turning to FIG. 4, a first plug 108b is formed from the first material 108, according to some embodiments. In some embodiments, the first plug 108b is formed in the first plug opening 106b, such that the first plug 108b is disposed along a first plug axis 109. In some embodiments, the first plug axis 109 is disposed vertically through a central portion of the first plug 108b. In some embodiments, the first plug 108b is formed by forming a first material opening 110a in the first material 108 on a first side of the first plug opening 106b and forming a second material opening 110b in the first material 108 on a second side of the first plug opening 106b. In some embodiments, at least one of the first material opening 110a or the second material opening 110b exposes at least some of the first dielectric layer portion 104. In some embodiments, a first material portion 108a remains on a first side of the first plug 108b. In some embodiments, a second material portion 108c remains on a second side of the first plug 108b. In some embodiments, at least one of the first material opening 110a or the second material opening 110b is formed by etching.

Figure 5:
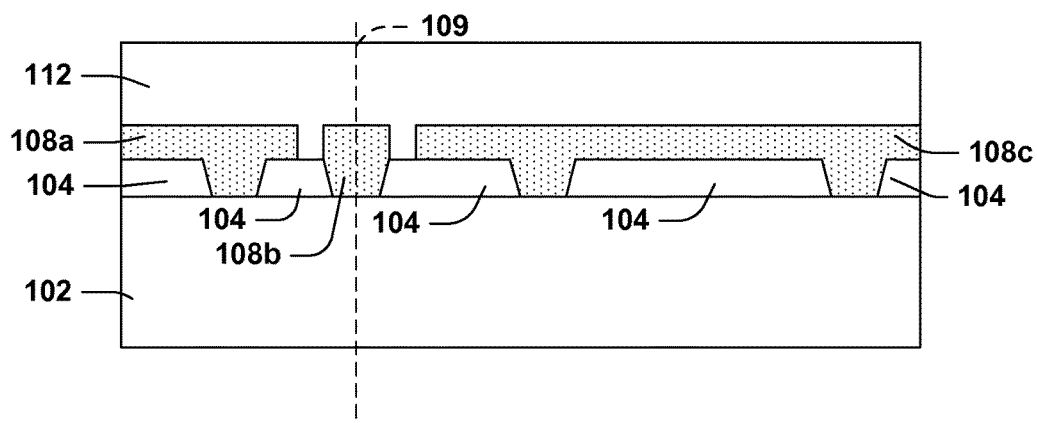
FIG. 5 is an illustration of a semiconductor arrangement at a stage of fabrication, in accordance with some embodiments.

Turning to FIG. 5, a second dielectric layer portion 112 is formed over the first material portion 108a, the first plug 108b, the second material portion 108c, and the first dielectric layer portion 104, according to some embodiments. In some embodiments, the second dielectric layer portion 112 is formed in substantially the same manner and comprises the same materials as described above with regard to the first dielectric portion 104, as illustrated in FIG. 1.

Figure 6:
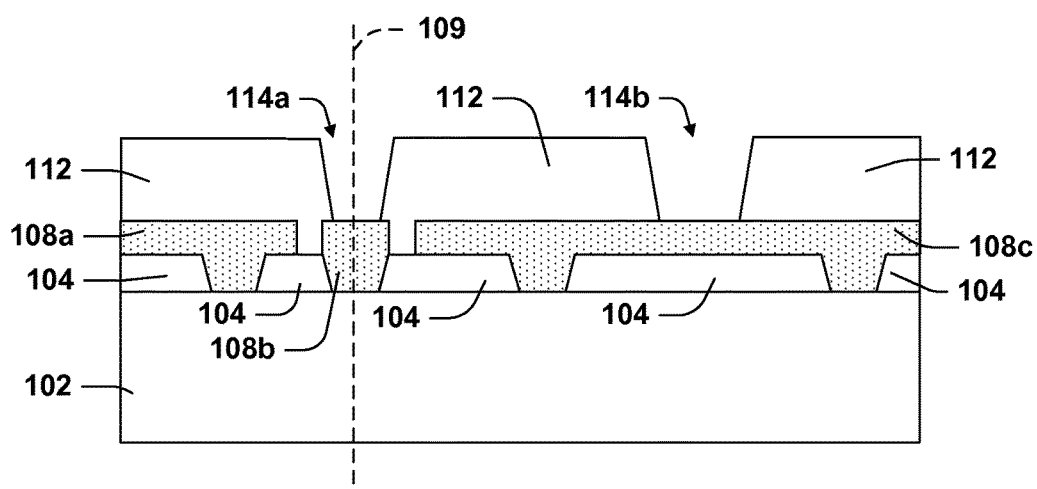
FIG. 6 is an illustration of a semiconductor arrangement at a stage of fabrication, in accordance with some embodiments.

Turning to FIG. 6, a second plug opening 114a is formed in the second dielectric layer portion 112, according to some embodiments. In some embodiments, the second plug opening 114a is formed along the first plug axis 109. In some embodiments, a fourth portion opening 114b is formed in the second dielectric layer portion 112. In some embodiments, the second plug opening 114a exposes at least some of the first plug 108b. In some embodiments, the fourth portion opening 114b exposes at least some of the second material portion 108c. In some embodiments, at least one of the second plug opening 114a or the fourth portion opening 114b is formed by etching, such as an anisotropic etch. In some embodiments, at least one of the second plug opening 114a or the fourth portion opening 114b has a top width greater than a bottom width.

Figure 7:
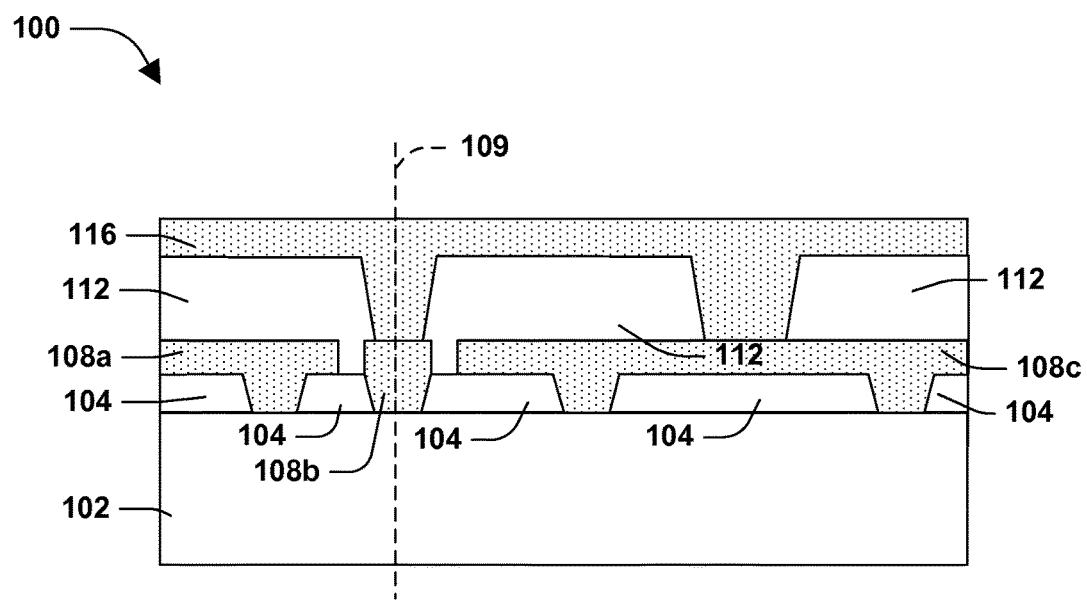
FIG. 7 is an illustration of a semiconductor arrangement at a stage of fabrication, in accordance with some embodiments.

Turning to FIG. 7, a second material 116 is formed over at least one of the second plug opening 114a, the fourth portion opening 114b, the first plug 108b or the second material portion 108c, according to some embodiments. In some embodiments, the second material 116 is formed by at least one of growth or deposition. In some embodiments, the second material 116 is formed by at least one of PVD, CVD, or ALD. In some embodiments, the second material 116 has an etch selectivity different than an etch selectivity of the second dielectric layer portion 112. In some embodiments, the second material 116 comprises polysilicon. In some embodiments, the second material 116 is at least one of the same or different than the first material 108.

Figure 8:
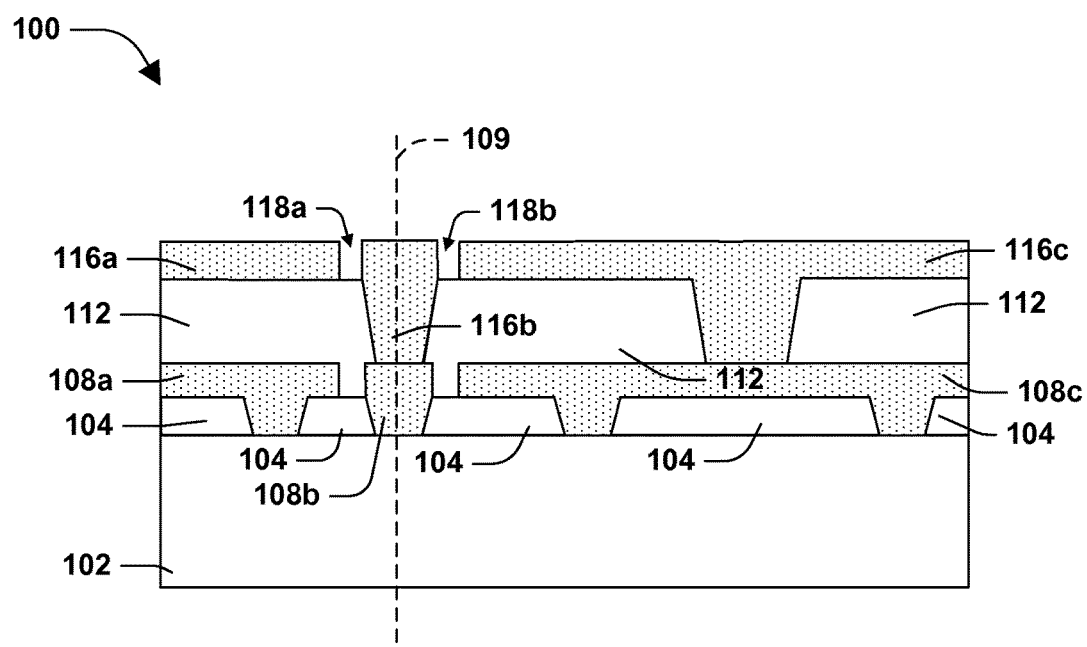
FIG. 8 is an illustration of a semiconductor arrangement at a stage of fabrication, in accordance with some embodiments.

Turning to FIG. 8, a second plug 116b is formed from the second material 116, over the first plug 108b, according to some embodiments. In some embodiments, the second plug 116b is formed in the second plug opening 114a. In some embodiments, the second plug 116b is formed by forming a third material opening 118a in the second material 116 on a first side of the second plug opening 114a and forming a fourth material opening 118b in the second material 116 on a second side of the second plug opening 114a. In some embodiments, the second plug 116b is disposed along the first plug axis 109. In some embodiments, at least one of the third material opening 118a or the fourth material opening 118b exposes at least some of the second dielectric layer portion 112. In some embodiments, a third material portion 116a remains on a first side of the second plug 116b. In some embodiments, a fourth material portion 116c remains on a second side of the second plug 116b. In some embodiments, at least one of the third material opening 118a or the fourth material opening 118b is formed by etching.

Figure 9:
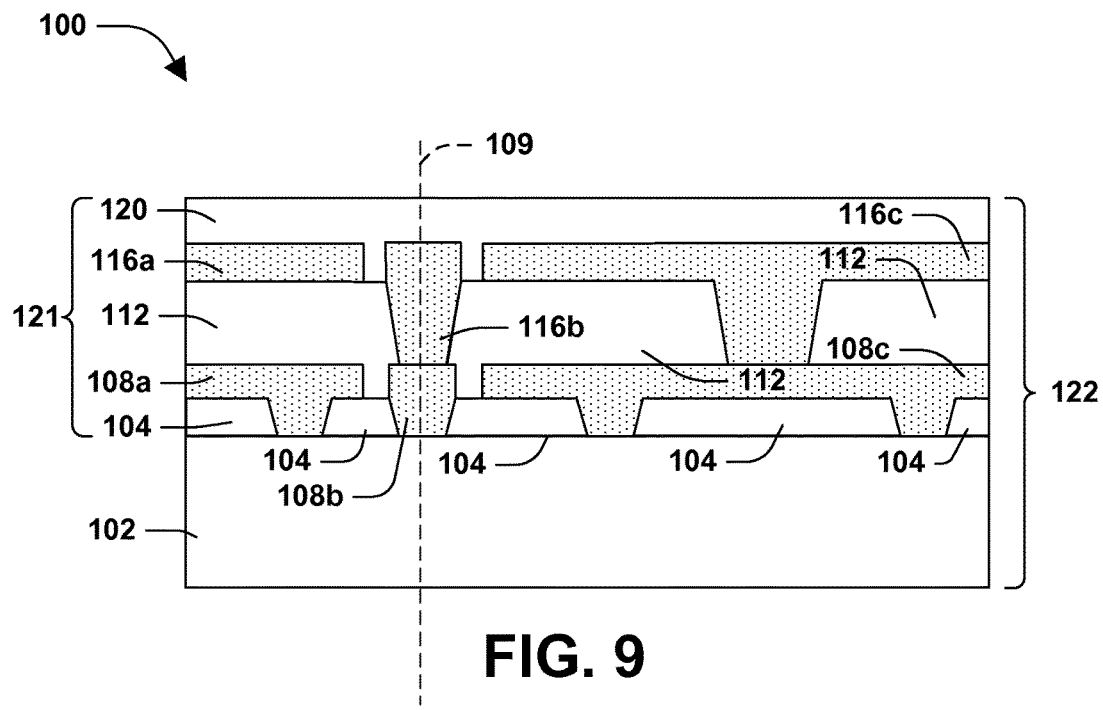
FIG. 9 is an illustration of a semiconductor arrangement at a stage of fabrication, in accordance with some embodiments.

Turning to FIG. 9, a third dielectric layer portion 120 is formed over the third material portion 116a, the second plug 116b, the fourth material portion 116c, and the second dielectric layer portion 112, according to some embodiments. In some embodiments, the third dielectric layer portion 120 is formed in substantially the same manner and comprises the same materials as described above with regard to the first dielectric portion 104, as illustrated in FIG. 1. In some embodiments, the formation of the third dielectric portion 120 forms a first dielectric layer 121. In some embodiments, the first dielectric layer 121 comprises at least one of the first dielectric layer portion 104, the second dielectric layer portion 112 or the third dielectric layer portion 120. In some embodiments, the first dielectric layer 121 has a thickness of between about 4 µm to about 20 µm. In some embodiments, the first dielectric layer 121 and the first substrate 102 comprise a first composite 122.

Figure 10:
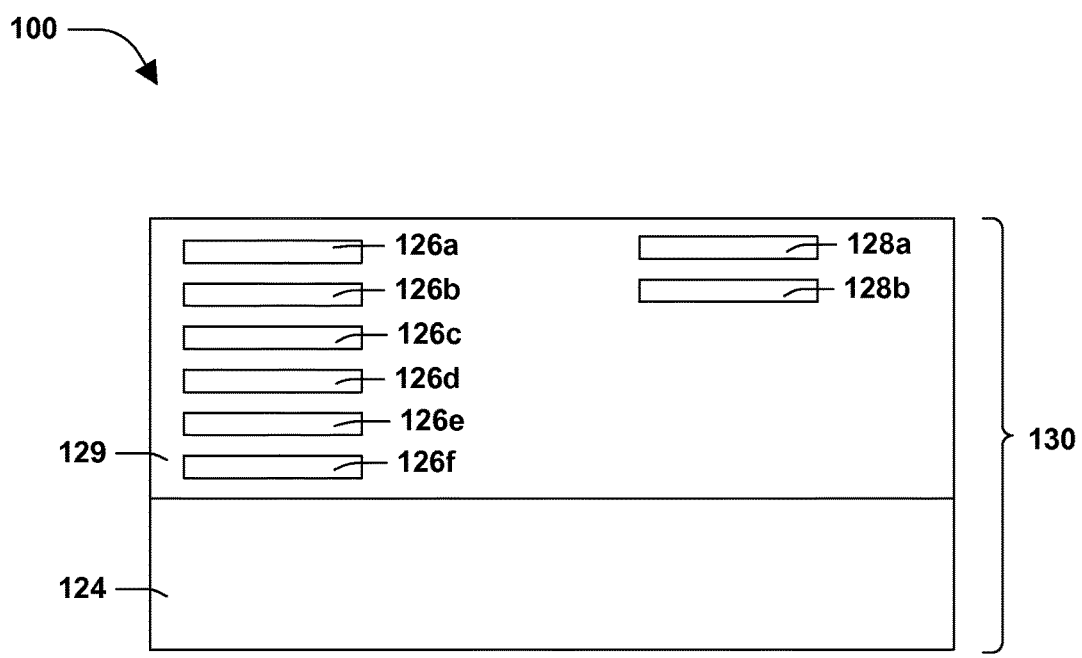
FIG. 10 is an illustration of a semiconductor arrangement at a stage of fabrication, in accordance with some embodiments.

Turning to FIG. 10, a second composite 130 comprises a second dielectric layer 129 over a second substrate 124, according to some embodiments. In some embodiments, the second substrate 124 includes at least one of an epitaxial layer, a silicon-on-insulator (SOI) structure, a wafer, or a die formed from a wafer. In some embodiments, the second substrate 124 comprises silicon, carbon, etc. In some embodiments, the second dielectric layer 129 comprises an oxide. In some embodiments, an arrangement of conductive layers 126a-126f is in the second dielectric layer 129. In some embodiments, the arrangement of conductive layers 126a-126f comprises a conductive material, such as metal. In some embodiments, at least one of a first metal layer 128a or a second metal layer 128b is in the second dielectric layer 129. In some embodiments, at least one of the first metal layer 128a or the second metal layer 128b is at least one of disposed linearly (as shown) or non-linearly. In some embodiments, the first metal layer 128a comprises at least one of a connection to a CMOS device or a portion of a CMOS device, etc. The first metal layer corresponding to other features, elements, components, etc. is within the scope of various embodiments.

Figure 11:
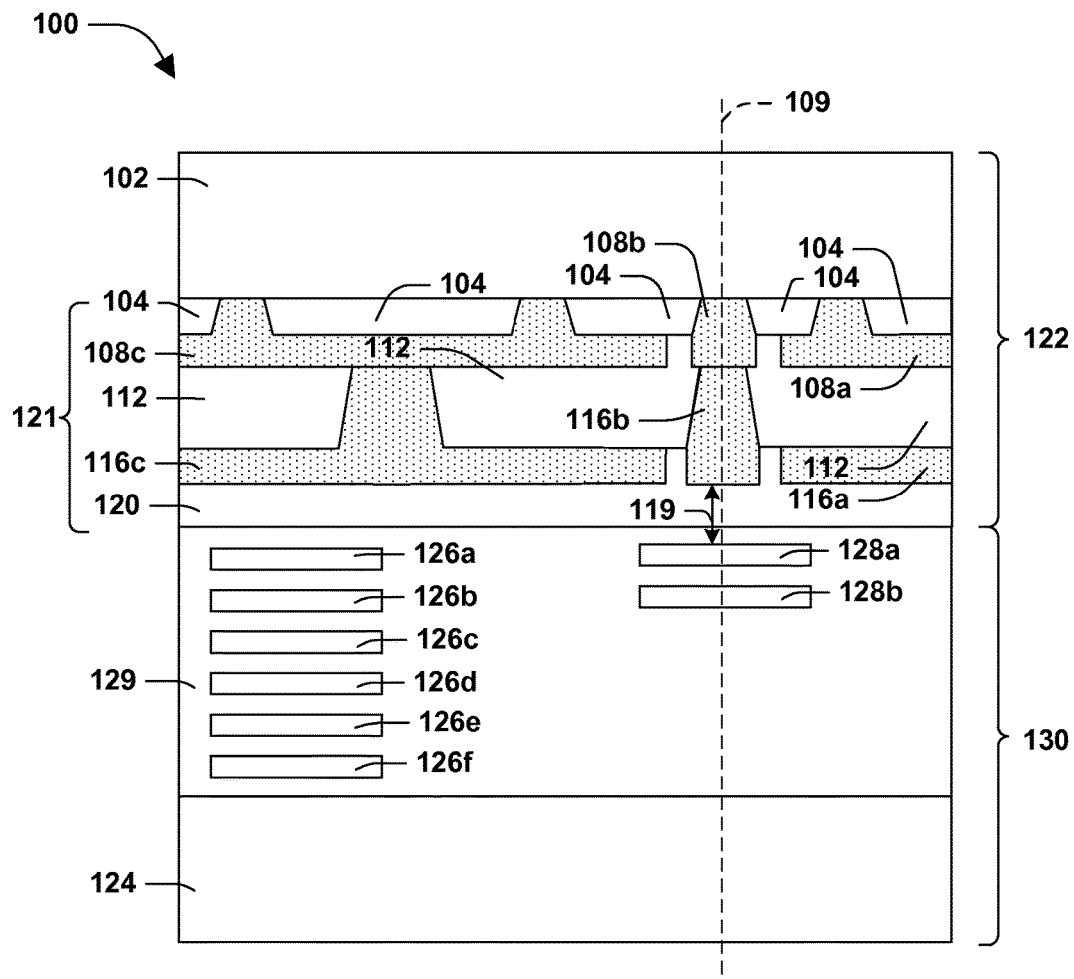
FIG. 11 is an illustration of a semiconductor arrangement at a stage of fabrication, in accordance with some embodiments.

Turning to FIG. 11, the first composite 122 is inverted and placed over the second composite 130, according to some embodiments. In some embodiments, the first composite 122 is placed over the second composite 130 such that the first metal layer 128a intersects the first plug axis 109. In some embodiments, a glue layer (not shown) binds the first composite 122 to the second composite 130. In some embodiments, the first composite 122 is placed over the second composite 130, such that the first dielectric layer 121 is in contact with the second dielectric layer 129. In some embodiments, the second plug 116b is a first distance 119 from the first metal layer 128a. In some embodiments, the first distance 119 is between about 0.5 µm to about 3 µm.

Figure 12:
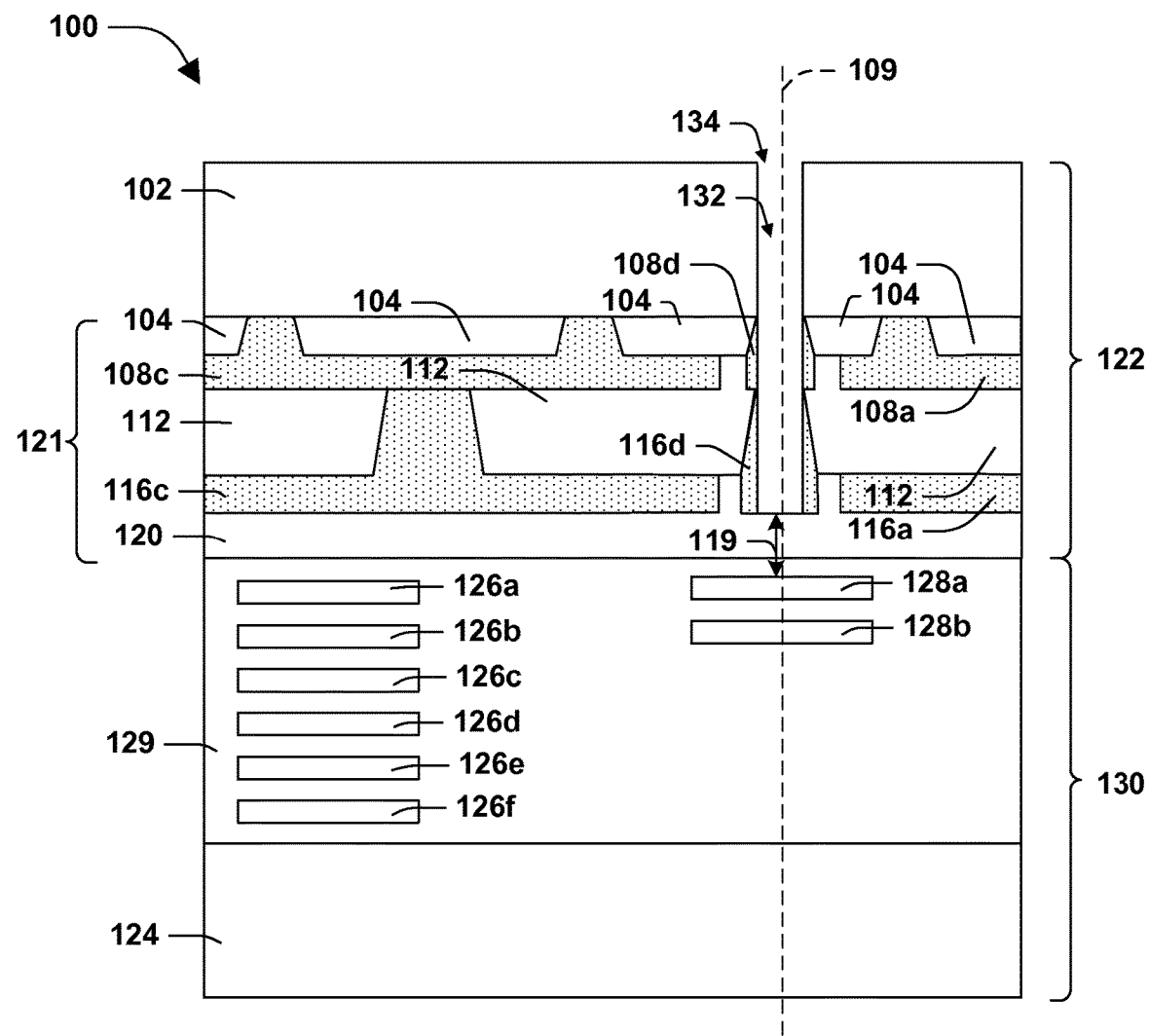
FIG. 12 is an illustration of a semiconductor arrangement at a stage of fabrication, in accordance with some embodiments.

Turning to FIG. 12, a first via portion opening 132 is formed along the first plug axis 109 through the first substrate 102, the first plug 108b, and the second plug 116b, according to some embodiments. In some embodiment, forming the first via portion opening 132 comprises removing a first central portion of the first plug 108b, such that a first plug portion 108d of the first plug 108b is not removed. In some embodiments, the first plug portion 108d comprises sidewalls that define a via opening 134 comprising the first via portion opening 132 and a second via portion opening 133 (discussed below). In some embodiment, forming the first via portion opening 132 comprises removing a second central portion of the second plug 116b, such that a second plug portion 116d of the second plug 116b is not removed. In some embodiments, the second plug portion 116d comprises sidewalls that define the via opening 134. In some embodiments, the first via portion opening 132 is formed by performing a first etch. In some embodiments, the first etch comprises using a first etchant comprising at least one of $SF_6$, $O_2$, etc. In some embodiments, the first etch is selective for at least one of the first substrate 102, the first plug 108b, or the second plug 116b. In some embodiments, the first via portion opening 132 is formed using a first mask.

Figure 13:
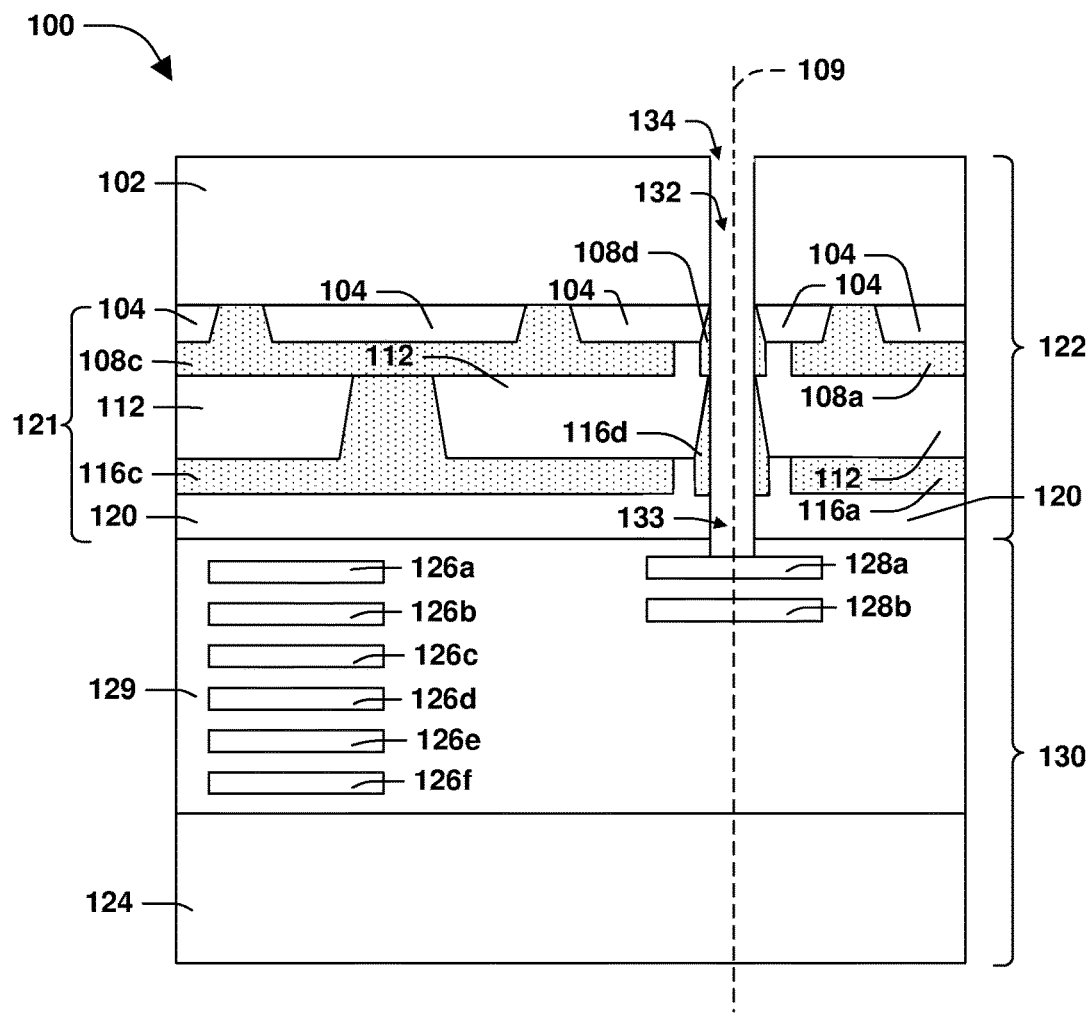
FIG. 13 is an illustration of a semiconductor arrangement at a stage of fabrication, in accordance with some embodiments.

Turning to FIG. 13, the second via portion opening 133 of the via opening 134 is formed by removing some the third dielectric layer portion 120 and some of the second dielectric layer 129 corresponding to the first distance 119, such that at least some of the first metal layer 128a is exposed, according to some embodiments. In some embodiments, the second via portion opening 133 is formed by performing a second etch using a second etchant comprising at least one of $HF_3$, $CHF_3$, etc. In some embodiments, the second etch is selective for at least one of the first dielectric layer 121 or the second dielectric layer 129. In some embodiments, the second via portion opening 133 is formed using the first mask.

Figure 14:
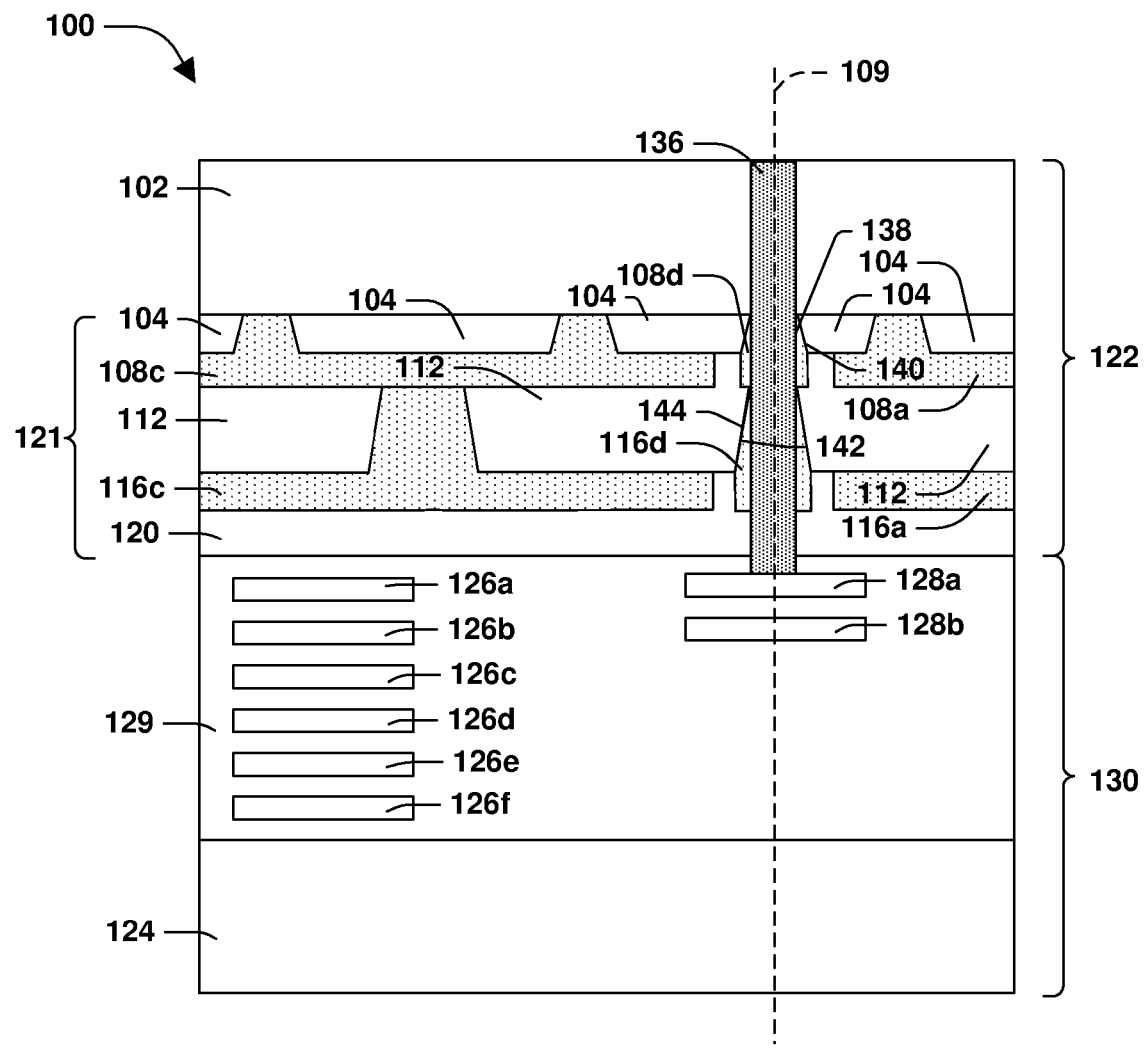
FIG. 14 is an illustration of a semiconductor arrangement at a stage of fabrication, in accordance with some embodiments.

Turning to FIG. 14, a via 136 is formed in the via opening 134, according to some embodiments. In some embodiments, the via 136 is formed by at least one of growth or deposition. In some embodiments, the via 136 comprises a conductive material, such as metal. In some embodiments, the via opening 134 has a relatively high aspect ratio, such as between about 5 to about 100, where the aspect ratio is the depth (from top to bottom on the page) of the via opening divided by the width (left to right on the page) of the via opening. In some embodiments the via 136 is in contact with a first sidewall 138 of the first plug portion 108d of the first plug 108b and a second sidewall 140 of the first plug portion 108d of the first plug 108b, opposite the first sidewall 138, has a tapered profile. In some embodiments the via is in contact with a first sidewall 142 of the second plug portion 116d of the second plug 116b and a second sidewall 144 of the second plug portion 116d of the second plug 116b, opposite the first sidewall 142, has a tapered profile. In the absence of the first plug 108b and the second plug 116b achieving the via opening with the relatively high aspect ratio is at least one of time consuming or imprecise given the etch selectivity of the first dielectric layer 121, at least relative to the etch selectivity of the first substrate 102. In some embodiments, including at least one of the first plug 108b or the second plug 116b allows the via opening 134 having the relatively high aspect ratio to be formed at least one of faster or more precisely, as compared to forming the via opening 134 in the absence of at least one of the first via plug or the second via plug, given the etch selectivity of the first plug and the second plug, at least relative to the etch selectivity of the first dielectric layer 121. In some embodiments, at least one of the first plug 108b or the second plug 116b improves a profile of the via opening 132a as compared to a via opening that is not formed through a first plug.

According to some embodiments, a semiconductor arrangement comprises a micro electro mechanical system (MEMS) comprising a first composite. In some embodiments, the first composite comprises a first substrate over a first dielectric layer. In some embodiments, a second composite is in contact with the first dielectric layer of the first composite. In some embodiments, the second composite comprises a second substrate, such that the first dielectric layer is between the first substrate and the second substrate. In some embodiments, a via connects the first composite to the second composite, the via having sidewalls in contact with at least one of a first plug portion or a second plug portion in the first dielectric layer.

According to some embodiments, a method of forming a semiconductor arrangement comprises forming a first composite comprising forming a first plug in contact with a first substrate, the first plug in a first dielectric layer portion and disposed along a first plug axis and forming a second dielectric layer portion over the first plug and the first dielectric layer portion, to form a first dielectric layer. According to some embodiments, the method of forming a semiconductor arrangement comprises placing the first composite over a second composite, such that the first dielectric layer is between the first substrate and the second composite. In some embodiments, the second composite comprises a second substrate and a first metal layer, where the first plug axis intersects the first metal layer. According to some embodiments, the method of forming a semiconductor arrangement comprises forming a via opening through the first substrate, the first plug, and the second dielectric layer such that the via opening exposes at least some of the first metal layer and forming a via in the via opening.

According to some embodiments, a semiconductor arrangement comprises a micro electro mechanical system (MEMS) comprising a first composite. In some embodiments, the first composite comprises a first substrate over a first dielectric layer and a second composite in contact with the first dielectric layer of the first composite. In some embodiments, the second composite comprises a second dielectric layer over a second substrate, such that the first dielectric layer in is in contact with the second dielectric layer, and the first dielectric layer and the second dielectric layer are between the first substrate and the second substrate. In some embodiments, a via connects the first composite to the second composite. In some embodiments, the via has sidewalls in contact with at least one of a first plug portion or a second plug portion in the first dielectric layer.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, features, elements, etc. mentioned herein, such as etching techniques, planarization techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement comprising:
   a micro electro mechanical system (MEMS) comprising:
      a first composite comprising:
         a first substrate over a first dielectric layer;
         a second composite in contact with the first dielectric layer of the first composite, the second composite comprising:
            a second substrate, such that the first dielectric layer is between the first substrate and the second substrate;
         a via connecting the first composite to the second composite; and
         a first plug portion having a first sidewall in contact with the via and a second sidewall in contact with the first dielectric layer, the second sidewall having a tapered portion such that a width between the via and the second sidewall at a first location is different than a width between the via and the second sidewall at a second location.

2. The semiconductor arrangement of claim 1, comprising a second dielectric layer between the second substrate and the first dielectric layer.

3. The semiconductor arrangement of claim 2, comprising a first metal layer in the second dielectric layer, the first metal layer comprising at least some of a complementary metal oxide semiconductor (CMOS).

4. The semiconductor arrangement of claim 3, the via connected to the first metal layer.

5. The semiconductor arrangement of claim 2, at least one of:
   the first dielectric layer comprising oxide; or
   the second dielectric layer comprising oxide.

6. The semiconductor arrangement of claim 1, the via comprising a metal.

7. The semiconductor arrangement of claim 1, the first plug portion comprising a first material, where the first material has an etch selectivity different than an etch selectivity of the first dielectric layer.

8. The semiconductor arrangement of claim 1, at least one the first substrate or the second substrate comprising silicon.

9. The semiconductor arrangement of claim 1, the first plug portion comprising polysilicon.

10. A semiconductor arrangement comprising:
    a micro electro mechanical system (MEMS) comprising:
      a first composite comprising:
        a first substrate over a first dielectric layer;
      a second composite in contact with the first dielectric layer of the first composite, the second composite comprising:
        a second dielectric layer over a second substrate, such that the first dielectric layer is in contact with the second dielectric layer, and the first dielectric layer and the second dielectric layer are between the first substrate and the second substrate;
      a via connecting the first composite to the second composite;
      a first plug portion through which the via extends; and
      a second plug portion through which the via extends, wherein a bottom surface of the first plug portion contacts the second plug portion and the first dielectric layer.

11. The semiconductor arrangement of claim 10, comprising a first metal layer in the second dielectric layer, the first metal layer comprising at least some of a complementary metal oxide semiconductor (CMOS).

12. The semiconductor arrangement of claim 11, the via connected to the first metal layer.

13. The semiconductor arrangement of claim 10, at least one of:
    the first dielectric layer comprising oxide; or
    the second dielectric layer comprising oxide.

14. The semiconductor arrangement of claim 10, at least one of the first plug portion or the second plug portion comprising a first material, where the first material has an etch selectivity different than an etch selectivity of at least one of the first dielectric layer or the second dielectric layer.

15. The semiconductor arrangement of claim 10, at least one of the first substrate or the second substrate comprising silicon.

16. A micro electro mechanical system (MEMS) device comprising:
    a first composite comprising:
      a dielectric layer having disposed therein a polysilicon plug;
    a second composite in contact with the dielectric layer and comprising:
      a second dielectric layer having disposed therein a metal layer; and
    a conductive via extending through the first composite to the metal layer, wherein a sidewall of the conductive via is in contact with a sidewall of the polysilicon plug, a sidewall of the dielectric layer, and a sidewall of the second dielectric layer.

17. The MEMS device of claim 16, the polysilicon plug having a first etch selectivity and the dielectric layer having a second etch selectivity different from the first etch selectivity.

18. The MEMS device of claim 16, a second sidewall of the polysilicon plug having a tapered profile.

19. The MEMS device of claim 18, the second sidewall of the polysilicon plug in contact with the dielectric layer.

20. The MEMS device of claim 16, the conductive via in contact with a top surface of the metal layer.

* * * * *